United States Patent
Carter et al.

(10) Patent No.: US 8,716,828 B2
(45) Date of Patent: May 6, 2014

(54) SEMICONDUCTOR DEVICE WITH ISOLATION TRENCH LINER

(75) Inventors: Richard J. Carter, Hopewell Junction, NY (US); George J. Kluth, Hopewell Junction, NY (US); Michael J. Hargrove, Clinton Corners, NY (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 9 days.

(21) Appl. No.: 13/473,175

(22) Filed: May 16, 2012

(65) Prior Publication Data

US 2012/0223399 A1    Sep. 6, 2012

Related U.S. Application Data

(62) Division of application No. 13/178,362, filed on Jul. 7, 2011, now Pat. No. 8,217,472, which is a division of application No. 12/199,616, filed on Aug. 27, 2008, now Pat. No. 7,998,832.

(51) Int. Cl.
*H01L 21/70* (2006.01)

(52) U.S. Cl.
USPC .... 257/510; 257/412; 257/411; 257/E21.546; 257/E29.255; 438/435; 438/436

(58) Field of Classification Search
CPC .......... H01L 21/76224; H01L 21/76232; H01L 29/665; H01L 29/6659; H01L 21/76229; H01L 21/823481; H01L 21/76202
USPC .......... 257/412, 411, 510, E21.546, E29.255; 438/435.436
See application file for complete search history.

(56) References Cited

U.S. PATENT DOCUMENTS

| | | | |
|---|---|---|---|
| 6,306,741 B1 | 10/2001 | Lee et al. | |
| 6,329,266 B1 | 12/2001 | Hwang et al. | |
| 6,936,881 B2 | 8/2005 | Yeo et al. | |
| 6,940,705 B2 | 9/2005 | Yeo et al. | |
| 7,071,515 B2 * | 7/2006 | Sheu et al. | 257/374 |
| 2004/0063300 A1 | 4/2004 | Chi | |
| 2004/0080019 A1 * | 4/2004 | Oh et al. | 257/510 |
| 2007/0032039 A1 | 2/2007 | Chen et al. | |
| 2007/0293045 A1 | 12/2007 | Youn et al. | |

FOREIGN PATENT DOCUMENTS

WO    2005/098923 A1    10/2005

OTHER PUBLICATIONS

EP Examination Report for European Patent Application No. 09 791 330.5, issued Aug. 9, 2012.
U.S. Office Action for U.S. Appl. No. 13/178,362, mailed Dec. 9, 2011.
U.S. Office Action for U.S. Appl. No. 12/199,616, mailed Dec. 29, 2010.
International Search Report for PCT/US2009/053271 mailed Nov. 2, 2009.

* cited by examiner

*Primary Examiner* — Thinh T Nguyen (57) ABSTRACT

A semiconductor device includes a layer of semiconductor material having an active transistor region defined therein, an isolation trench formed in the semiconductor material adjacent the active transistor region, and a trench liner lining the isolation trench, wherein the trench liner is formed from a material that substantially inhibits formation of high-k material thereon, and wherein the isolation trench and the trench liner together form a lined trench. The device has an insulating material in the lined trench, and high-k gate material overlying at least a portion of the insulating material and overlying at least a portion of the active transistor region, such that the trench liner divides and separates the high-k gate material overlying the at least a portion of the insulating material from the high-k gate material overlying the at least a portion of the active transistor region.

18 Claims, 6 Drawing Sheets

SEMICONDUCTOR DEVICE WITH ISOLATION TRENCH LINER

CROSS-REFERENCE TO RELATED APPLICATION

This application is a divisional of U.S. patent application Ser. No. 13/178,362, filed Jul. 7, 2011, which is a divisional of U.S. patent application Ser. No. 12/199,616, filed Aug. 27, 2008, and issued on Aug. 16, 2011 as U.S. Pat. No. 7,998,832.

TECHNICAL FIELD

Embodiments of the subject matter described herein relate generally to semiconductor devices. More particularly, embodiments of the subject matter relate to the use of isolation regions between metal oxide semiconductor transistors.

BACKGROUND

The majority of present day integrated circuits (ICs) are implemented by using a plurality of interconnected field effect transistors (FETs), which may be realized as metal oxide semiconductor field effect transistors (MOSFETs or MOS transistors). A MOS transistor may be realized as a p-type device (i.e., a PMOS transistor) or an n-type device (i.e., an NMOS transistor). Moreover, a semiconductor device can include both PMOS and NMOS transistors, and such a device is commonly referred to as a complementary MOS or CMOS device. A MOS transistor includes a gate electrode as a control electrode that is formed over a semiconductor substrate, and spaced-apart source and drain regions formed within the semiconductor substrate and between which a current can flow. The source and drain regions are typically accessed via respective silicide conductive contacts formed on the source and drain regions. Bias voltages applied to the gate electrode, the source contact, and the drain contact control the flow of current through a channel in the semiconductor substrate between the source and drain regions beneath the gate electrode. Conductive metal interconnects (plugs) formed in an insulating layer are typically used to deliver bias voltages to the gate, source, and drain contacts.

Figure 1A:
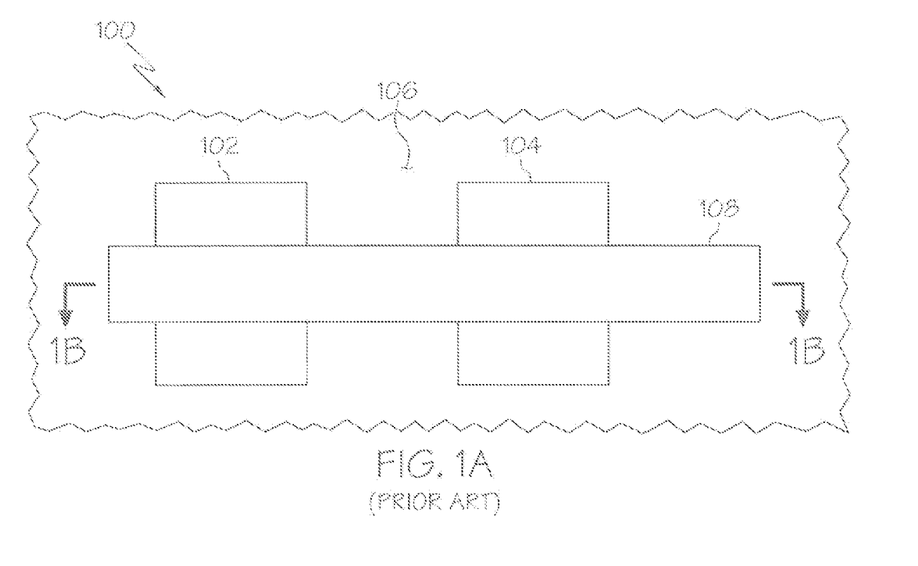
FIG. 1 is a simplified diagram of a CMOS transistor device structure that has been fabricated using conventional techniques.
Figure 1B:
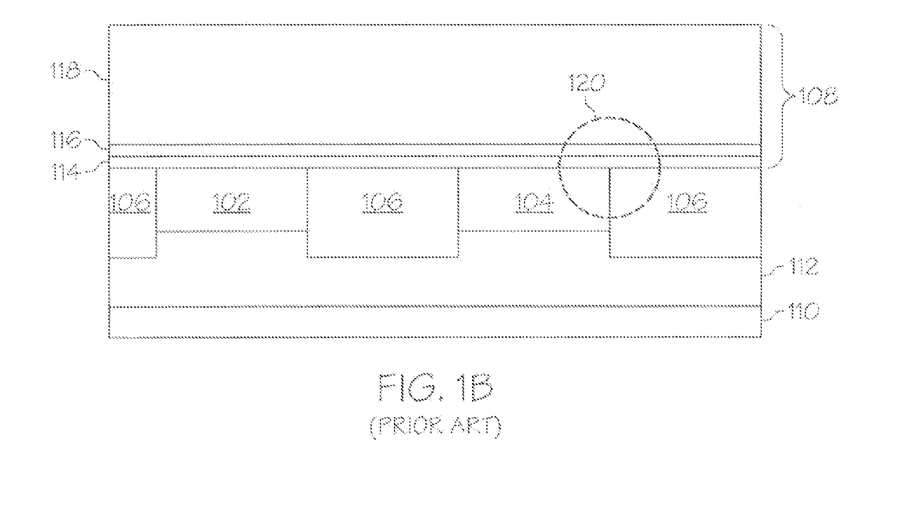

FIG. 1 is a simplified diagram of a CMOS transistor device structure 100 that has been fabricated using conventional techniques. The upper portion of FIG. 1 (FIG. 1A) represents a top view of device structure 100, and the lower portion of FIG. 1 (FIG. 1B) represents a cross section of device structure 100 as viewed from line 1B-1B in the upper portion of FIG. 1. Device structure 100 includes an n-type active region 102 of semiconductor material, a p-type active region 104 of semiconductor material, shallow trench isolation (STI) 106 surrounding and separating n-type region 102 and p-type region 104, and a gate structure 108 overlying n-type region 102, p-type region 104, and STI 106. Device structure 100 is formed on a silicon-on-insulator (SOI) substrate having a physical support substrate 110 and an insulating material 112 (typically a buried oxide) on support substrate 110. Gate structure 108 includes a gate insulator layer 114, which is formed from a dielectric material having a relatively high dielectric constant (i.e., a high-k material). Gate structure 108 also includes a gate metal layer 116 overlying gate insulator layer 114, and a layer of polycrystalline silicon 118 overlying gate metal layer 116.

Figure 2:
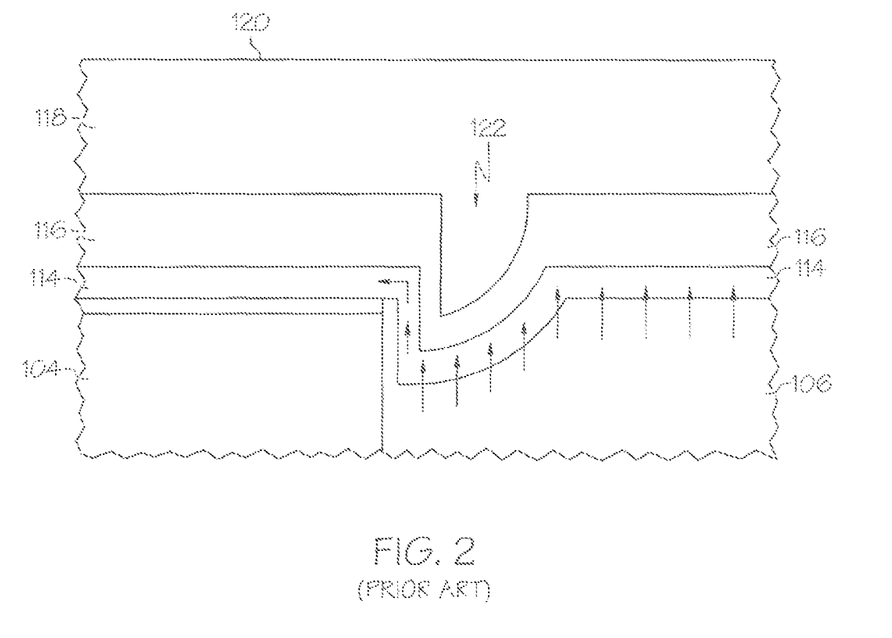
FIG. 2 is a detailed view of a region of the CMOS transistor device structure shown in FIG. 1.

FIG. 2 is a detailed view of a region 120 of device structure 100 (this region 120 is surrounded by the dashed circle in FIG. 1). FIG. 2 shows a divot 122 that can be formed as a result of one or more process steps that lead to the formation of device structure 100. Gate insulation layer 114, gate metal layer 116, and polycrystalline silicon 118 generally follow the contour of divot 122 as they are formed. The arrows in FIG. 2 represent the liberation of oxygen from STI 106 into gate insulator layer 114. The diffusion of oxygen through the high-k gate insulator layer 114 and over p-type region 104 causes the "width effect," which can degrade device performance. Although not shown in FIG. 2, the oxygen also diffuses in over the adjacent n-type region, which would be located to the right of the portion of STI 106 shown in FIG. 2. Notably, devices with shorter channel region lengths are more susceptible to the width effect.

The width effect can be reduced using a number of known techniques. One known approach for reducing the width effect adds silicon to the high-k material. However, this adds control issues to dielectric deposition, and adversely impacts scaling. Another known approach for reducing the width effect employs nitridation of the high-k material. However, excess nitridation degrades device performance and can adversely affect the threshold voltage of the device. Yet another approach utilizes oxygen scavenging metals to create the metal gate layer. Unfortunately, oxygen scavenging metals have inherent control issues, which lead to excess variability in the process. The width effect can also be addressed by attempting to minimize the amount of overlap between the underlying STI material and the high-k gate material. Such techniques require additional masking layers, and such techniques might violate existing controls and rules mandated by the particular manufacturing process node. One additional approach encapsulates the STI material with a nitride diffusion barrier prior to the deposition of the high-k material. This approach is unproven, and it leads to significant process complexity for the isolation module and variability to subsequent process modules.

BRIEF SUMMARY

A method of manufacturing a semiconductor device structure is provided. The method begins by providing a substrate having semiconductor material. An isolation trench is formed in the semiconductor material, and the trench is lined with a liner material that substantially inhibits formation of high-k material thereon. The lined trench is filled with an insulating material, over which is formed a layer of high-k gate material. The high-k gate material is formed such that it overlies at least a portion of the insulating material and at least a portion of the semiconductor material, and such that the layer of high-k gate material is divided by the liner material.

A semiconductor device is also provided. The semiconductor device includes a layer of semiconductor material having an active transistor region defined therein, an isolation trench formed in the layer of semiconductor material adjacent to the active transistor region, a trench liner lining the isolation trench, an insulating material in the lined trench, and a layer of high-k gate material overlying at least a portion of the insulating material and overlying at least a portion of the active transistor region. The layer of high-k gate material is divided by the trench liner.

Also provided is a shallow trench isolation method for a semiconductor device structure. This method begins by providing a semiconductor substrate having a layer of semiconductor material, a pad oxide layer overlying the layer of semiconductor material, and a pad nitride layer overlying the pad oxide layer. The method then forms an isolation trench in the semiconductor substrate by selective removal of a portion of the pad nitride layer, a portion of the pad oxide layer, and a portion of the layer of semiconductor material. A liner material is deposited in the isolation trench and on exposed portions of the pad nitride layer, wherein the liner material substantially inhibits nucleation of high-k material thereon. In addition, an insulating material is deposited over the liner material such that the insulating material fills the isolation trench.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor based transistors are well known and so, in the interest of brevity, many conventional steps will only be mentioned briefly herein or will be omitted entirely without providing the well known process details.

The techniques and technologies described herein may be utilized to fabricate MOS transistor devices, including NMOS transistor devices, PMOS transistor devices, and CMOS transistor devices. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

The fabrication process described herein can be utilized to manufacture semiconductor devices having a high-k gate insulator and a metal gate overlying the high-k gate insulator. In particular, a semiconductor device fabricated in accordance with this process includes an STI liner that serves as an oxygen migration barrier between the STI oxide material and the high-k gate insulator. The STI liner eliminates (or significantly reduces) the diffusion of oxygen into that portion of the high-k gate insulator that overlies the active transistor region, thus minimizing the impact of the phenomena known as the width effect. As described in more detail below, the STI liner material is selected such that the high-k material does not nucleate on the STI liner material, which causes the STI liner to separate the high-k gate insulator into a first section (located over the STI material) and a second section (located over the active transistor region).

Figure 3:
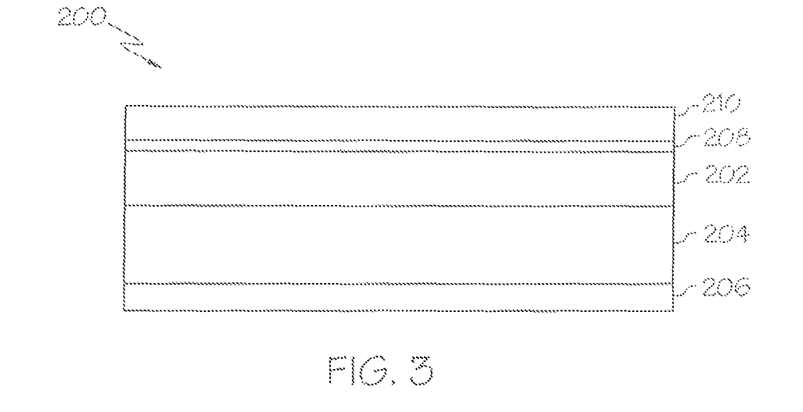
FIGS. 3-12 are cross sectional views that illustrate the fabrication of a semiconductor device structure.

Referring now to FIG. 3, fabrication of a semiconductor device structure begins by providing an appropriate semiconductor substrate 200 having a layer of semiconductor material 202. This fabrication process represents one implementation of a trench isolation method that is suitable for use with a semiconductor device, such as a CMOS transistor device. For this embodiment, semiconductor substrate 200 is realized as a silicon-on-insulator (SOI) substrate, where semiconductor material 202 is disposed on a layer of insulator material 204 that, in turn, is supported by a carrier layer 206. More specifically, semiconductor material 202 is a silicon material, and insulator material 204 is a buried oxide layer. The term "silicon material" is used herein to encompass the generally monocrystalline and relatively pure silicon materials typically used in the semiconductor industry. Semiconductor material 202 can originally be either N-type or P-type silicon, but is typically P-type, and semiconductor material 202 is subsequently doped in an appropriate manner to form active regions. For this embodiment, insulator material 204 is realized as a layer of silicon oxide ($SiO_2$). In alternate embodiments, the semiconductor device structure can be formed on a bulk silicon substrate rather than an SOI substrate.

FIG. 3 depicts semiconductor substrate 200 after formation of a pad oxide layer 208 on semiconductor material 202, and after formation of a pad nitride layer 210 on pad oxide layer 208. The resulting structure includes pad oxide layer 208 overlying semiconductor material 202, along with pad nitride layer 210 overlying pad oxide layer 208. Conventional process steps can be used to arrive at the structure depicted in FIG. 3. For example, pad oxide layer 208 is grown to the desired thickness, then pad nitride layer 210 is deposited over pad oxide layer 208 using an appropriate chemical vapor deposition (CVD) technique.

Figure 4:
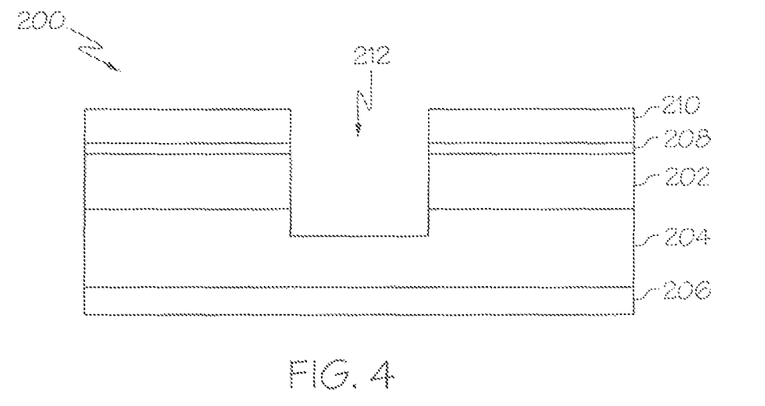

Semiconductor substrate 200 is then processed in an appropriate manner to form a suitably sized isolation trench 212 in semiconductor material 202 (FIG. 4). As depicted in FIG. 4, isolation trench 212 can be formed by selectively removing a portion of pad nitride layer 210, a portion of pad oxide layer 208, and a portion of semiconductor material 202. For this SOI implementation, formation of isolation trench 212 also involves the selective removal of a portion of insulator material 204 underlying semiconductor material 202. FIG. 4 depicts the state of semiconductor substrate 200 after completion of a number of known process steps, including photolithography, masking, and etching steps. Notably, isolation trench 212 extends into insulator material 204 to provide sufficient isolation between the portions of semiconductor material 202 on either side of isolation trench 212.

Although other fabrication steps or sub-processes may be performed after the step in the process depicted in FIG. 4, this example continues by lining isolation trench 212 with an appropriate liner material 214. Liner material 214 can be deposited in isolation trench 212 and on any exposed portions of pad nitride layer 210 using any suitable technique, such as CVD, low pressure CVD (LPCVD), or plasma enhanced CVD (PECVD). Although preferred embodiments utilize a CVD material, liner material 214 could be a thermally grown material in alternate embodiments. Notably, liner material 214 is a material that substantially inhibits formation of high-k materials thereon. In other words, the composition of liner material 214 is such that high-k materials (the deposition of which is highly surface selective) do not nucleate on exposed surfaces of liner material 214. In practice, liner material 214 is a dielectric material such as a nitride, preferably, silicon nitride, and liner material 214 is formed with a typical thickness of about 20-100 Angstroms.

Figure 5:
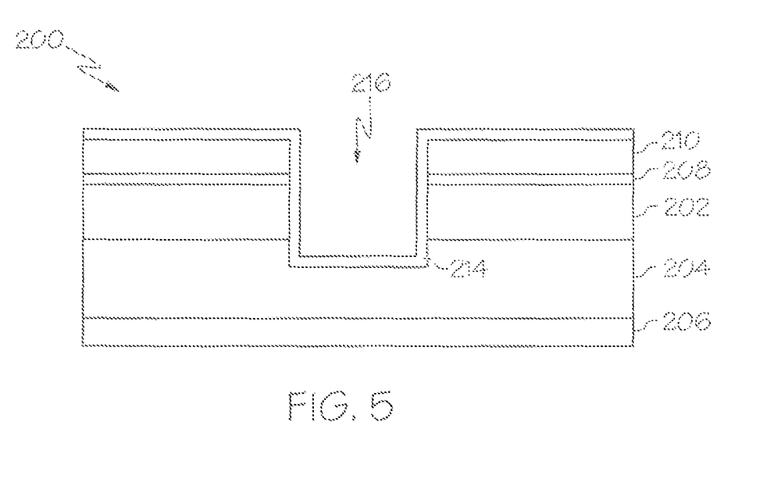
Figure 6:
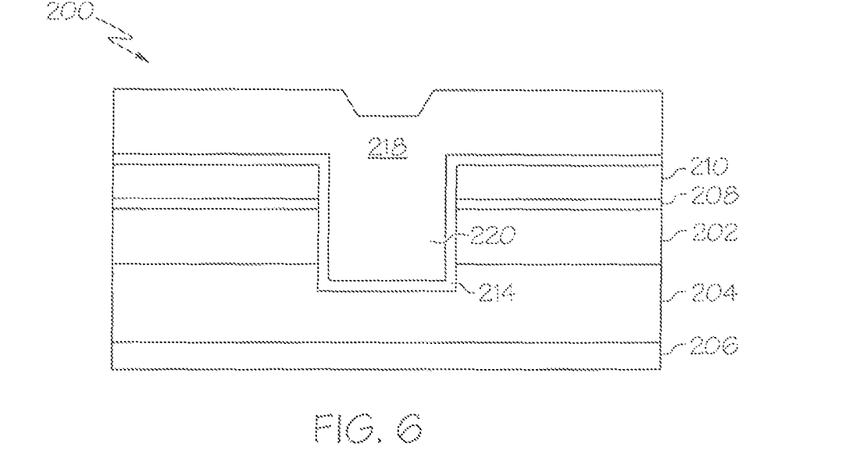

As illustrated in FIG. 5, liner material 214 forms a lined trench 216 in semiconductor substrate 200. Although other fabrication steps or sub-processes may be performed after lining isolation trench 212, this example continues by at least partially filling lined trench 216 with a suitable insulating material, referred to herein as STI material 218 (FIG. 6). In practice, the dielectric STI material 218 fills lined trench 216 and is also formed over the other sections of liner material 214 (i.e., the sections overlying pad nitride layer 210) using, for example, an appropriate deposition technique such as CVD. In certain embodiments, STI material 218 is an oxide material, such as silicon dioxide deposited using tetraethyl orthosilicate (TEOS) as a silicon source (commonly referred to as TEOS oxide). As another example, silane is a very common precursor for the silicon source, and the resulting STI material 218 is commonly referred to as high density plasma (HDP) oxide.

Figure 7:
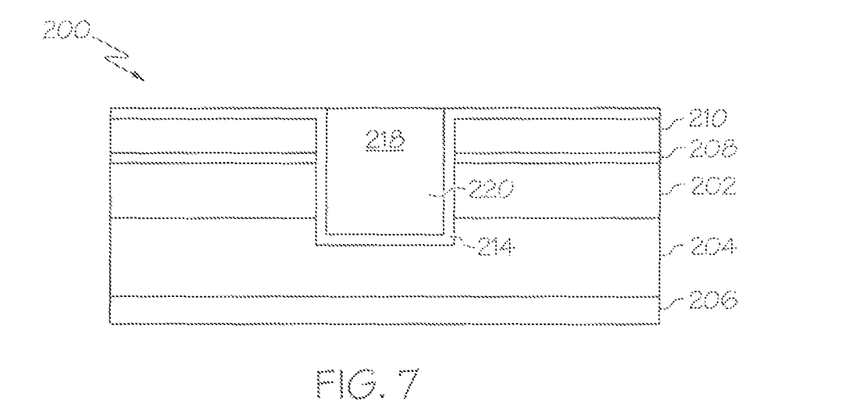

At the stage of the process depicted in FIG. 6, STI material 218 creates a filled isolation trench 220 in semiconductor substrate 200. Thereafter, STI material 218 is polished using, for example, a chemical mechanical polishing (CMP) tool. STI material 218 is preferably polished to a height approximately corresponding to the height of the liner material 214 overlying pad nitride layer 210. In practice, the nitride liner material 214 may serve as a CMP stop layer such that the top of STI material 218 is substantially continuous with the exposed surface of liner material 214. FIG. 7 illustrates the condition of semiconductor substrate 200 after STI material 218 has been polished or planarized to the desired height.

Figure 8:
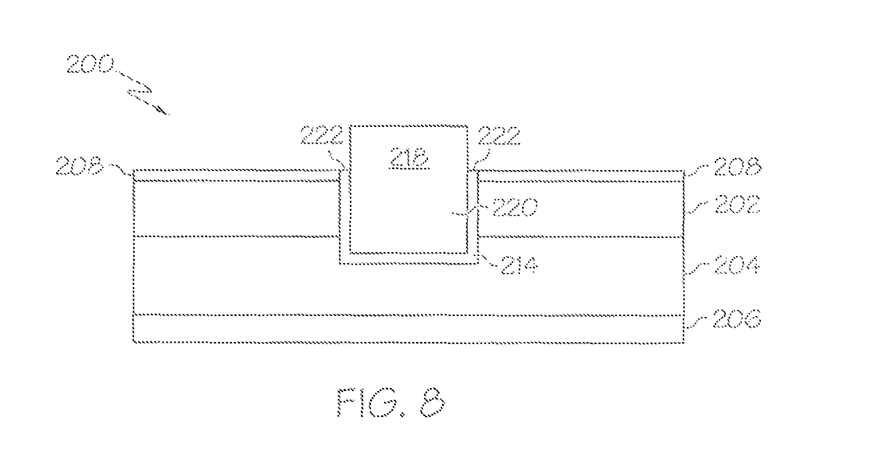

Although other fabrication steps or sub-processes may be performed after polishing STI material 218, this example continues by removing pad nitride layer 210 and a portion of liner material 214, while leaving STI material 218 substantially intact (FIG. 8). The nitride and liner material can be removed using a technique that is selective to nitride, for example, a hot phosphoric acid strip. As depicted in FIG. 8, this step is controlled such that pad nitride layer 210 is completely removed and such that an exposed upper rim 222 of liner material 214 remains. Referring again to the top view of FIG. 1, upper rim 222 would roughly correspond to the boundary defined by the outline of region 102 or region 104. The selective nature of this stripping step ensures that STI material 218 and pad oxide layer 208 are not removed. Accordingly, the portion of liner material 214 underlying STI material 218 is protected.

Figure 9:
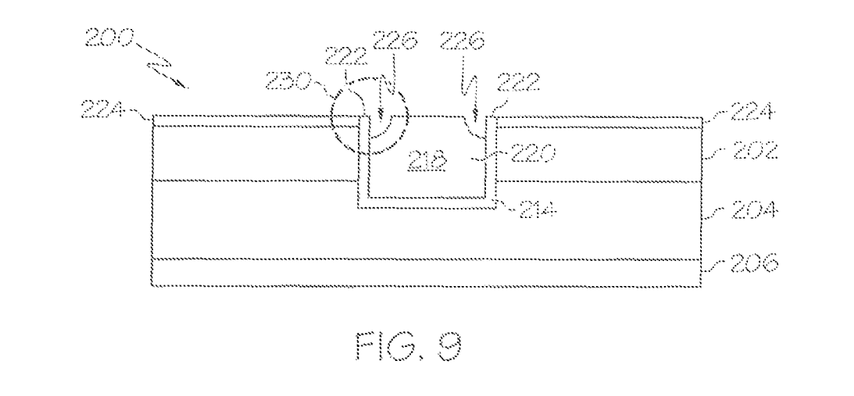

A number of process steps or sub-steps may be performed following completion of the step depicted in FIG. 8. For example, FIG. 9 depicts the state of semiconductor substrate 200 after further processing that may be needed prior to formation of the gate stack. Such further process steps may include, without limitation: removing pad oxide layer 208; forming a layer of sacrificial oxide 224 that replaces pad oxide layer 208; forming well implants with sacrificial oxide 224 in place; and wet etching. These process steps recess the height of STI material 218, but leave liner material 214 substantially intact. Moreover, STI material 218 may be subjected to an isotropic oxide etchant, resulting in divots 226 formed on the sides of STI material 218. Importantly, upper rim 222 of liner material 214 remains uncovered and exposed after semiconductor substrate 200 reaches the state shown in FIG. 9.

Figure 10:
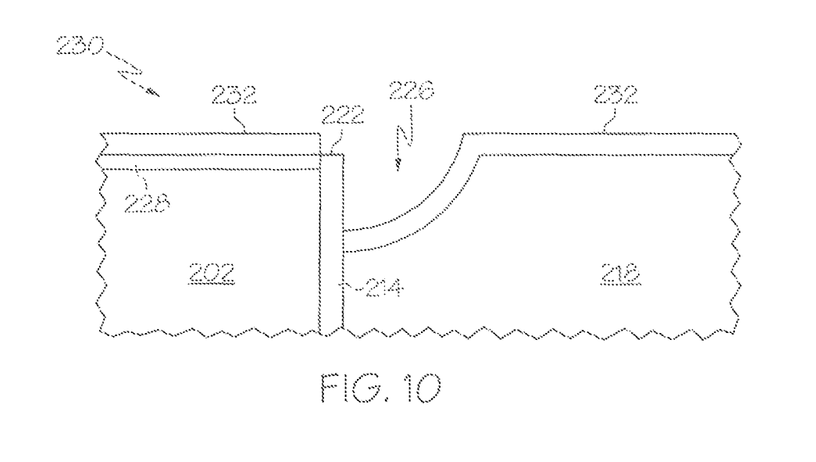

Sacrificial oxide 224, which may be removed during the wet etching described above, is replaced with an interfacial insulator layer 228 is formed (FIG. 10). Interfacial insulator layer 228 is preferably formed from an oxide material. FIG. 10 is a detailed view of a region 230 of semiconductor substrate 200 (this region 230 is surrounded by the dashed circle in FIG. 9). The scale used in FIG. 10 is exaggerated for ease of illustration. Moreover, although the height of upper rim 222 corresponds to the height of interfacial insulator layer 228 in the illustrated embodiment, liner material 214 may protrude above the height of interfacial insulator layer 228, or it may be level with the height of semiconductor material 202 and level with the height of STI material 218.

Although other fabrication steps or sub-processes may be performed after formation of interfacial insulator layer 228, this example continues by forming a layer of high-k gate material 232 overlying at least a portion of semiconductor material 202 and overlying at least a portion of STI material 218. In practice, high-k gate material can be deposited using any suitable technique, such as atomic layer deposition (ALD) or atomic layer chemical vapor deposition (ALCVD), which enables selective deposition of the high-k material on interfacial insulator layer 228 and on STI material 218, while resulting in little to no deposition on upper rim 222 of liner material 214. ALD and ALCVD are very surface-sensitive processes in that the exposed surface on which the high-k material is to be deposited must have certain material properties (e.g., chemical bonds and molecular structure), otherwise, the high-k material will not nucleate. In practice, high-k gate material 232 can be any material having a high dielectric constant relative to silicon dioxide, and such high-k materials are well known in the semiconductor industry. Depending upon the embodiment, high-k gate material 232 may be, without limitation: $HfO_2$, $ZrO_2$, HfZrOx, HfSiOx, HfSiON, HfTiOx, ZrTiOx, ZrSiOx, ZrSiON, HfLaOx, ZrLaOx, LaAlOx, $La_2O_3$, HfAlOx, ZrAlOx, $Al_2O_3$, $Y_2O_3$, MgO, DyO, $TiO_2$, $Ta_2O_5$, or the like. High-k gate material 232 is preferably deposited to a thickness of about 14-22 Angstroms.

As mentioned previously, liner material 214 is chosen to substantially inhibit nucleation of high-k materials thereon, and this property causes the exposed upper rim 222 to remain void (for all practical purposes) of high-k gate material 232, as depicted in FIG. 10. Notably, the layer of high-k gate material 232 is divided by liner material 214, and liner material 214 creates a discontinuity in the layer of high-k gate material 232. In the illustrated embodiment, the section of high-k material overlying interfacial insulator layer 228 terminates before it overlaps upper rim 222, and the section of high-k material overlying STI material 218 follows the contour of divot 226 and terminates at or near the sidewall of liner material 214.

Figure 11:
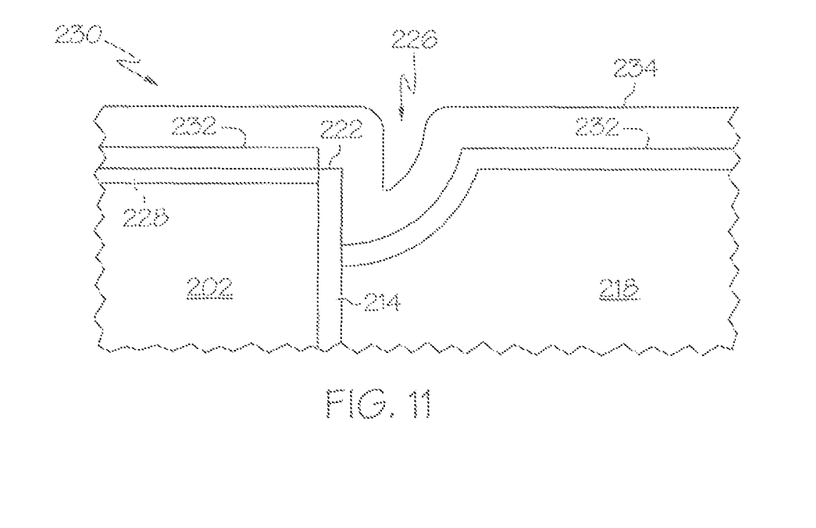

Although other fabrication steps or sub-processes may be performed after the deposition of high-k gate material 232, this example continues by completing the gate stack in a conventional manner. In this regard, a metal gate layer 234 is formed over high-k gate material 232 and over the exposed portions of liner material 214 (FIG. 11) and, thereafter, a polysilicon gate layer 236 is formed over metal gate layer 234

Figure 12:
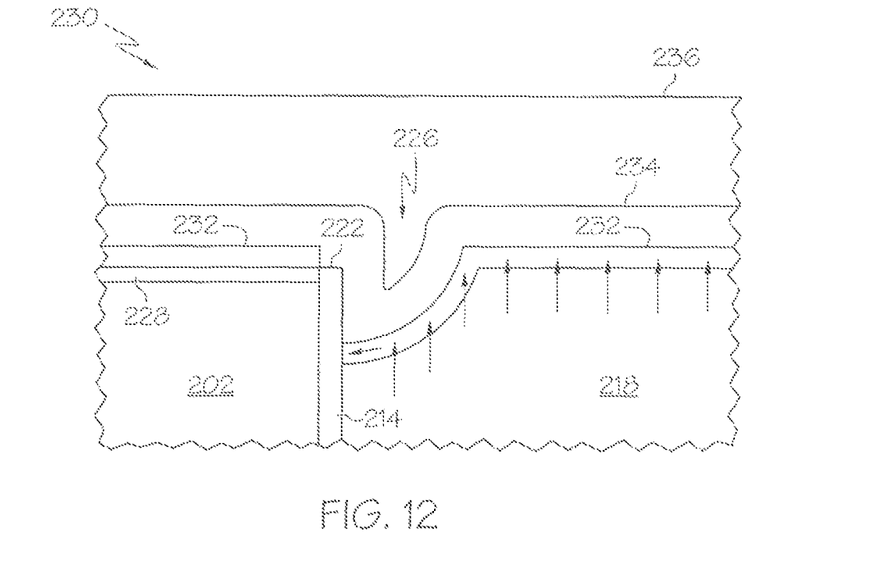

(FIG. 12). Unlike high-k gate material 232, metal gate layer 234 can and does form on the exposed surfaces of liner material 214. Accordingly, metal gate layer 234 generally follows the contour of high-k gate material 232 and liner material 214 near divot 226. Moreover, polysilicon gate layer 236 is deposited to a desired thickness such that it fills divot 226, as shown in FIG. 12.

The arrows in FIG. 12 represent the liberation of oxygen from STI material 218 into high-k gate material 232. Unlike the conventional device structure shown in FIG. 2, the oxygen does not migrate or diffuse into the section of high-k gate material 232 that overlies semiconductor material 202. In other words, liner material 214 blocks the migration of oxygen from the section of high-k gate material 232 that overlies STI material 218. Consequently, liner material 214 can be used to reduce the width effect, which might otherwise degrade device performance (as explained above). It should be appreciated that even if a very thin layer of high-k gate material 232 forms on liner material 214, the migration of oxygen will be substantially impeded and, therefore, the same benefits will be obtained.

After the stage in the fabrication process depicted in FIG. 12, any number of known process steps can be performed to complete the fabrication of the device structures. Moreover, the process techniques described herein can be utilized with a "gate first" process or with a "gate last" process (which replaces polysilicon gate layer 236 with a different metal material).

Figure 13:
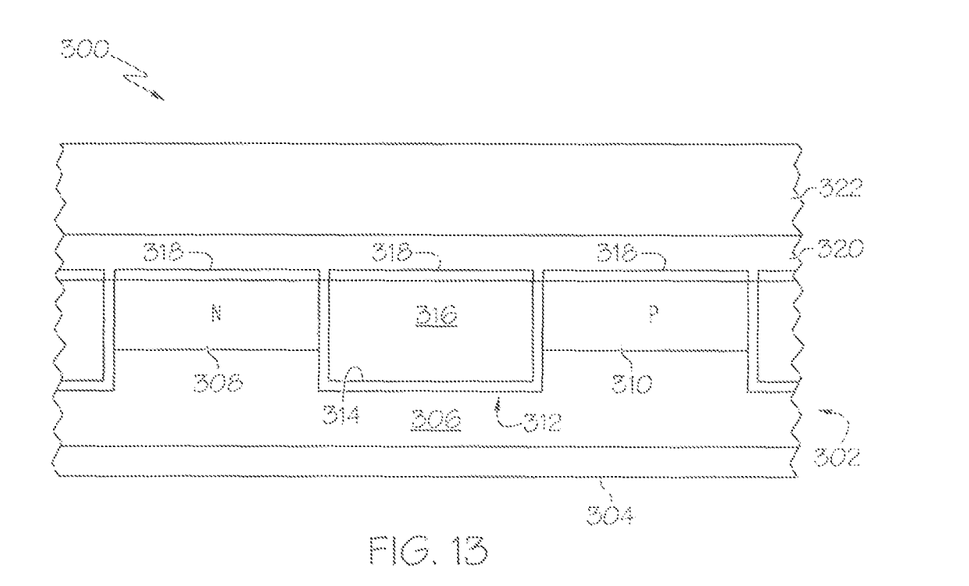
FIG. 13 is a cross sectional view of a semiconductor device structure fabricated in accordance with the process depicted in FIGS. 3-12.

FIG. 13 is a cross sectional view of a semiconductor device 300 fabricated in accordance with the process depicted in FIGS. 3-12. Most of the features and characteristics of semiconductor device 300 are similar or identical to those described above with reference to FIGS. 3-12, and such common features and characteristics will not be redundantly described in detail here. This embodiment of semiconductor device 300 is formed on an SOI substrate 302 having a support layer 304 and a buried oxide layer 306 overlying support layer 304. The layer of semiconductor material overlying buried oxide layer 306 has active transistor regions defined therein; FIG. 13 depicts an n-type active transistor region 308 and a p-type active transistor region 310.

The active transistor regions 308 and 310 are separated by an adjacent isolation trench 312, which is formed in the layer of semiconductor material and in buried oxide layer 306. Isolation trench 312 is lined with a trench liner 314 (e.g., a nitride material), and an insulating material such as an STI oxide 316 is located in the lined trench. Semiconductor device 300 also includes a layer of high-k gate material 318 overlying at least a portion of STI oxide 316 and overlying at least a portion of active transistor regions 308 and 310. It is important to note that the layer of high-k gate material 318 is divided by trench liner 314 because, as described above, the high-k gate material 318 cannot nucleate on the upper rim of trench liner 314. For simplicity and ease of illustration, the interfacial oxide layer between high-k gate material 318 and the active transistor regions 308 and 310 (see FIG. 12), and the divots on either side of STI oxide 316, are not shown in FIG. 13.

Semiconductor device 300 also includes a metal gate layer 320 overlying high-k gate material 318, and overlying the upper rim of trench liner 314. In addition, semiconductor device 300 includes a polysilicon gate layer 322 overlying metal gate layer 320. The combination of high-k gate material 318, metal gate layer 320, and polysilicon gate layer 322 may be referred to as a gate stack or a gate structure. The gate stack cooperates with active transistor regions 308 and 310 in a conventional manner to form NMOS and PMOS transistor devices.

In lieu of a trench liner that inhibits nucleation of high-k material, a semiconductor device may employ a layer of high-k material that is formed in an alternative manner that still reduces the width effect. More specifically, the high-k material can be formed using a suitably controlled plasma vapor deposition (PVD) technique. The PVD process will naturally form the high-k material over the exposed surface of the interfacial oxide and over the exposed surface of the STI oxide. However, due to the directional nature of the PVD process, the amount of high-k material formed on the vertical sidewall of the divot (see FIG. 2) will be significantly less than the amount of high-k material formed elsewhere. Consequently, the very thin layer of high-k material on this sidewall of the divot will impede the migration of oxygen from the STI oxide side to the side overlying the active transistor region.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A semiconductor device comprising:
   a layer of semiconductor material having an active transistor region defined therein;
   an isolation trench formed in the layer of semiconductor material adjacent to the active transistor region;
   a trench liner lining the isolation trench, wherein the trench liner is formed from a material that substantially inhibits formation of high-k material thereon, and wherein the isolation trench and the trench liner together form a lined trench;
   an insulating material in the lined trench; and
   a high-k gate material overlying at least a portion of the insulating material and overlying at least a portion of the active transistor region, wherein the trench liner creates a discontinuity in the high-k gate material between a portion of the high-k gate material overlying the portion of the insulating material and a portion of the high-k gate material overlying the portion of the active transistor region.

2. The semiconductor device of claim 1, wherein the trench liner divides and separates the high-k gate material overlying the at least a portion of the insulating material from the high-k gate material overlying the at least a portion of the active transistor region.

3. The semiconductor device of claim 2, wherein the trench liner forms an oxygen barrier between the high-k gate material overlying the portion of the insulating material and the high-k gate material overlying the portion of the active transistor region.

4. The semiconductor device of claim 2, wherein:
   the trench liner includes an upper rim; and
   the upper rim is substantially void of the high-k gate material.

5. The semiconductor device of claim 2, further comprising:
   a metal gate layer overlying the high-k gate material and overlying the trench liner;
   and a polysilicon gate layer overlying the metal gate layer.

6. The semiconductor device of claim 2, wherein the trench liner is formed from a nitride material.

7. The semiconductor device of claim 2, wherein the insulating material is an oxide material.

8. The semiconductor device of claim 1, wherein the trench liner separates the high-k gate material overlying the at least a portion of the insulating material from the high-k gate material overlying the at least a portion of the active transistor region.

9. The semiconductor device of claim 1, wherein the trench liner forms an oxygen barrier between the high-k gate material overlying the portion of the insulating material and the high-k gate material overlying the portion of the active transistor region.

10. The semiconductor device of claim 1, wherein:
    the trench liner includes an upper rim; and
    the upper rim is substantially void of the high-k gate material.

11. The semiconductor device of claim 1, further comprising:
    a metal gate layer overlying the high-k gate material and overlying the trench liner;
    and a polysilicon gate layer overlying the metal gate layer.

12. The semiconductor device of claim 1, wherein the trench liner is formed from a nitride material.

13. The semiconductor device of claim 1,
    wherein the trench liner forms an oxygen barrier between the high-k gate material overlying the portion of the insulating material and the high-k gate material overlying the portion of the active transistor region.

14. The semiconductor device of claim 13, wherein the trench liner separates the high-k gate material overlying the at least a portion of the insulating material from the high-k gate material overlying the at least a portion of the active transistor region.

15. The semiconductor device of claim 2, wherein the trench liner forms an oxygen barrier between the high-k gate material overlying the portion of the insulating material and the high-k gate material overlying the portion of the active transistor region.

16. The semiconductor device of claim 13, wherein:
    the trench liner includes an upper rim; and
    the upper rim is substantially void of the high-k gate material.

17. The semiconductor device of claim 13, further comprising:
    a metal gate layer overlying the high-k gate material and overlying the trench liner;
    and a polysilicon gate layer overlying the metal gate layer.

18. The semiconductor device of claim 13, wherein the trench liner is formed from a nitride material.

\* \* \* \* \*